United States Patent
Zhou

(10) Patent No.: US 9,847,354 B2
(45) Date of Patent: Dec. 19, 2017

(54) TFT ARRAY SUBSTRATE AND MANUFACTURING AND REPAIRING METHODS OF THE SAME

(75) Inventor: Baoquan Zhou, Beijing (CN)

(73) Assignees: BOE TECHNOLOGY GROUP CO., LTD., Beijing (CN); HEFEI BOE OPTOELECTRONICS TECHNOLOGY CO., LTD., Hefei, Anhui (CN)

( * ) Notice: Subject to any disclaimer, the term of this patent is extended or adjusted under 35 U.S.C. 154(b) by 330 days.

(21) Appl. No.: 13/456,599

(22) Filed: Apr. 26, 2012

(65) Prior Publication Data
US 2012/0280257 A1 Nov. 8, 2012

(30) Foreign Application Priority Data

May 6, 2011 (CN) .......................... 2011 1 0116521

(51) Int. Cl.
*H01L 33/08* (2010.01)
*H01L 27/12* (2006.01)
*G02F 1/1362* (2006.01)
*H01L 29/417* (2006.01)

(52) U.S. Cl.
CPC ...... *H01L 27/124* (2013.01); *G02F 1/136259* (2013.01); *H01L 29/41733* (2013.01)

(58) Field of Classification Search
CPC ............. H01L 27/124; H01L 29/41733; G02F 1/136259
USPC .......................................... 257/88, E33.062
See application file for complete search history.

(56) References Cited

U.S. PATENT DOCUMENTS

2002/0050967 A1  5/2002  Hashimoto et al.
2008/0268581 A1* 10/2008  Chin et al. .................... 438/151

FOREIGN PATENT DOCUMENTS

| CN | 1359020 A | 7/2002 |
| CN | 101494201 A | 7/2009 |
| CN | 101833203 A | 9/2010 |
| TW | 200403508 A | 3/2004 |

OTHER PUBLICATIONS

First Chinese Office Action dated Mar. 3, 2014; Appln. No. 201110116521.X.
Chinese Rejection Decision Appln. No. 201110116521.X; dated Jan. 13, 2015.
Second Chinese Office Action dated Jul. 25, 2014; Appln. No. 201110116521.X.

* cited by examiner

*Primary Examiner* — Hrayr A Sayadian
(74) *Attorney, Agent, or Firm* — Ladas & Parry LLP; Loren K Thompson

(57) ABSTRACT

A thin film transistor liquid crystal display (TFT-LCD) array substrate is provided, including a base substrate; a first transparent conductive film formed on the base substrate; for each pixel unit of the array substrate the first transparent conductive film comprises at least a first part and a second part that do not contact with each other, and the first part is located under an area of the data line, without contacting the gate line and the common electrode line. When a data line in the array substrate has an open failure, this part of the transparent conductive film can be welded together with the data line using laser welding so as to repair the data line.

7 Claims, 3 Drawing Sheets

TFT ARRAY SUBSTRATE AND MANUFACTURING AND REPAIRING METHODS OF THE SAME

BACKGROUND

Embodiments of the disclosed technology relate to a thin film transistor liquid (TFT) array substrate and manufacturing and repairing methods of the same.

Thin-film-transistor liquid crystal displays (TFT-LCDs) have become the mainstream of the current commercially available LCDs for various advantages including smaller volumes, light weight, lower power consumption and little radiation, and take a dominant role in the flat display market. An advanced-super dimensional switching (AD-SDS) type LCD forms a multi-dimensional electric field with parallel electric fields formed by perimeters of pixel electrodes within a same level and longitudinal electric fields formed by pixel electrodes and common electrodes that are located on different levels, causing all liquid crystal molecules between and on top of the pixel electrodes within the LCD panel to rotate, thereby increasing the efficiency of the liquid crystal materials and improving the transmission rate.

In a conventional technology, an AD-SDS type TFT-LCD array substrate and generally comprises the following layered structure: an first indium-tin oxide (ITO) layer formed over a glass substrate, which is also referred to as a first transparent conductive film; a gate layer formed over the first ITO layer for forming a gate line, a common electrode line, a gate electrode and a common electrode; a first insulating layer formed on the gate layer and covering the whole first ITO layer; a semiconductor layer and a source/drain electrode layer formed above the first insulating layer; a second insulating layer formed on the source/drain layer and covering the whole first insulating layer with a through hole formed in the second insulating layer; a pixel electrode formed on the second insulating layer and connected to a drain electrode in the source/drain electrode layer via the through hole in the second insulating layer; and a second ITO layer formed over the second insulating layer. In this way, the layered structure including the above layers form a gate line, a data line, a common electrode line, a pixel electrode, a common electrode and a thin film transistor (TFT) needed for a pixel unit of a TFT display. The pixel electrode and the common electrode construct a capacitor, and can generate a horizontal electric field after applied a voltage along the plane of the substrate such that LC molecules can be tilted regularly. The TFT acts as a switching element for charging and discharging of the capacitor (liquid crystal capacitor). The gate line provides on-voltage for turning on the switching element, and the data line provides a source signal needed for charging the liquid crystal capacitor for displaying. The common electrode line provides a common voltage for the first ITO layer.

In the conventional array substrate, when a data line has a failure, typical repairing methods includes mainly a laser cutting method, a laser chemical vapor deposition (laser CVD) method, a laser welding method, and the like. With respect to a date line failure open, usually a laser CVD tool is employed to bridge the broken parts by using tungsten powders, and the area around the bridge is processed by laser cutting or scraping of ITO film and the like. Among the repairing technologies for a data line failure open, the bridging method consumes tungsten and may bring about damages to the ITO layer of a pixel during the laser cutting or the scraping of ITO film. As a result, problems exist such as high repairing cost, long repairing time period and disadvantageous influence on adjacent pixels.

SUMMARY

Embodiments of the disclosed technology provide a thin film transistor liquid crystal display (TFT-LCD) array substrate and manufacturing and repairing methods of the same.

According to an embodiment, a TFT-LCD substrate and is provided, comprising a base substrate; a first transparent conductive film, a gate layer, a gate insulating layer, a semiconductor layer, and a source/drain electrode layer sequentially formed on the base substrate from the bottom up, wherein for one pixel unit of the array substrate the gate layer comprises a gate electrode, a gate line and a common electrode line, the source/drain electrode layer comprises a data line and a source electrode and a drain electrode of a transistor, the first transparent conductive film comprises at least a first part and a second part that do not contact with each other, and the first part is located under an area of the data line, without contacting the gate line and the common electrode line.

According to another embodiment, a display device is provided, comprising the TFT-LCD array substrate and described above.

According to further another embodiment, a manufacturing method for a TFT-LCD array substrate is provided, comprising: depositing a first transparent conductive film on a base substrate, the first transparent conductive film having a first part and a second part that do not contact with each other; sequentially forming a gate layer, a gate insulating layer, a semiconductor layer, and a source/drain electrode layer from the bottom up over the base substrate having the first transparent conductive film formed thereon, wherein for one pixel unit of the array substrate the gate layer comprises a gate electrode, a gate line and a common electrode line, the source/drain electrode layer comprises a data line and a source electrode and a drain electrode of a transistor, and the first part of the first transparent conductive film is located under an area of the data line without contacting the gate line and the common electrode line.

According to still another embodiment, a method for repairing the above described TFT-LCD array substrate is provided, comprising determining a failure pixel unit on the array substrate; determining a position of a data line in the source/drain electrode layer of the failure pixel unit; and connecting the first part of the first transparent conductive film and the data line of the failure pixel unit by using laser welding at the determined position.

According to the embodiment of the disclosed technology, for each pixel unit the first transparent conductive film has two separate parts that do not contact with each other. One of the two parts is located under the data line. Thus, when a data line has for example an open failure, the part of the transparent conductive film located under the data line may be used as a standby line. That is, this part of the transparent conductive film may be welded together with the data line directly using laser welding so as to repair the failed data line.

Further scope of applicability of the disclosed technology will become apparent from the detailed description given hereinafter. However, it should be understood that the detailed description and specific examples, while indicating preferred embodiments of the disclosed technology, are given by way of illustration only, since various changes and modifications within the spirit and scope of the disclosed technology will become apparent to those skilled in the art from the following detailed description.

BRIEF DESCRIPTION OF THE DRAWINGS

The disclosed technology will become more fully understood from the detailed description given hereinafter and the accompanying drawings which are given by way of illustration only, and thus are not limitative of the disclosed technology and wherein.

DETAILED DESCRIPTION

Figure 1:
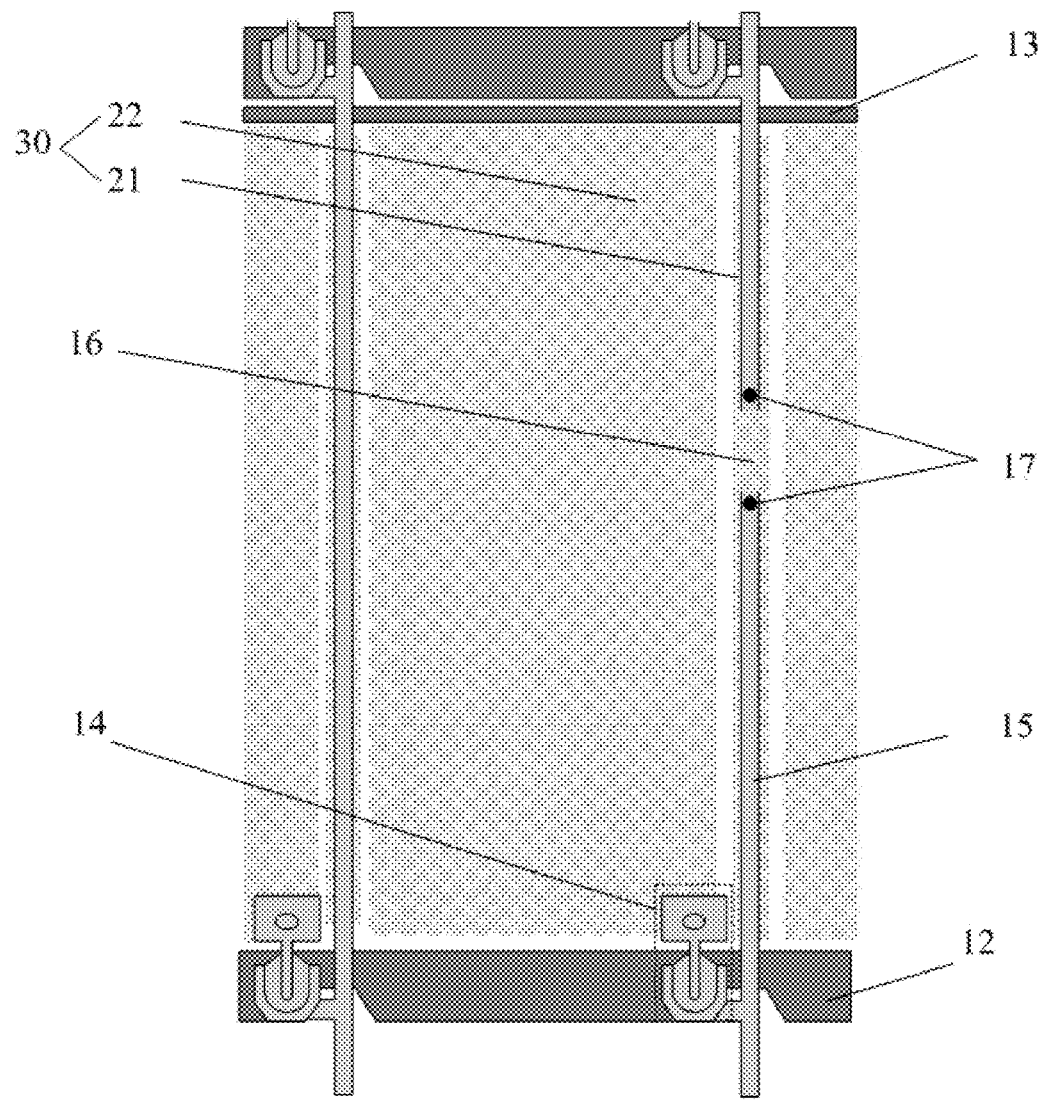
FIG. 1 is a structural diagram of an array substrate during a data line repairing after a source/drain electrode layer is formed according to an embodiment of the disclosed technology.
Figure 2:
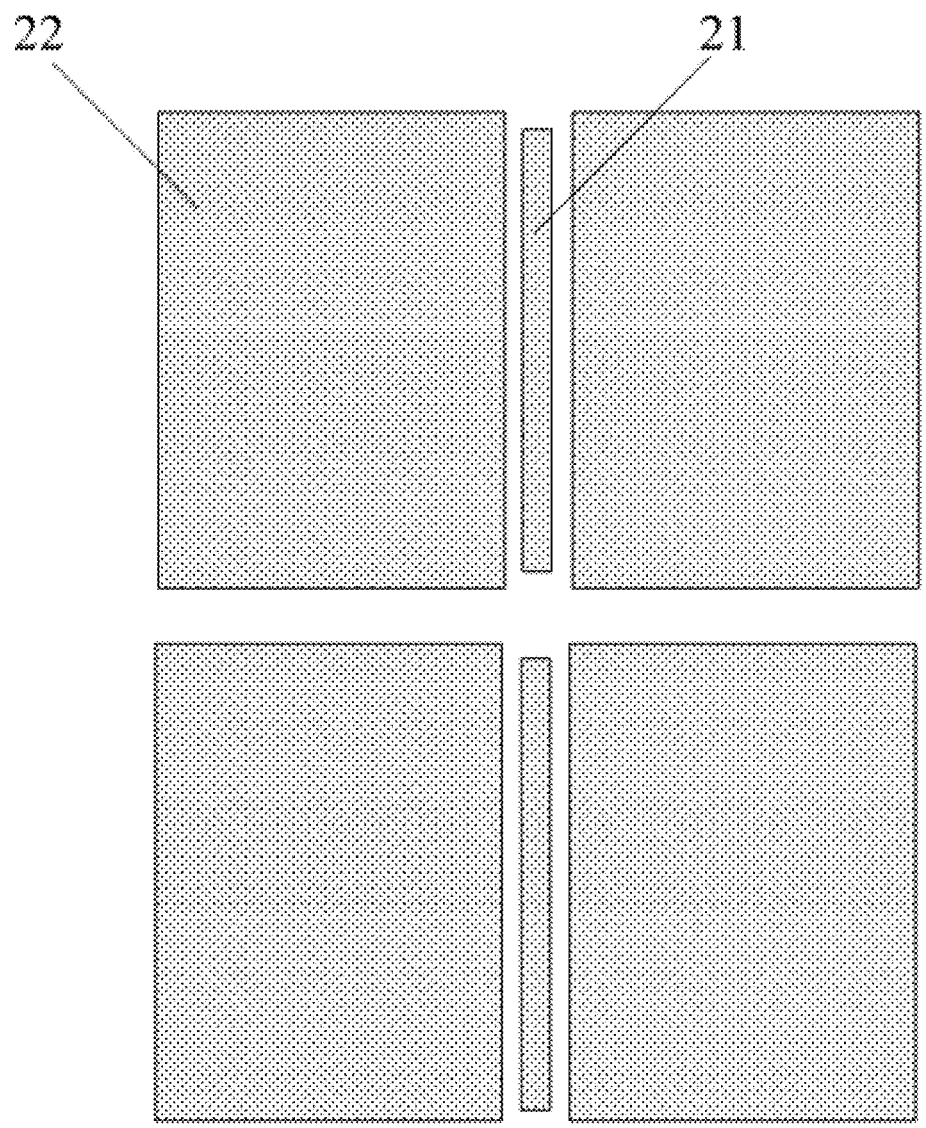
FIG. 2 is a structural diagram of a first transparent conductive film of an array substrate according to an embodiment of the disclosed technology.

The embodiment of the disclosed technology being thus described, it will be obvious that the same may be varied in many ways. Such variations are not to be regarded as a departure from the spirit and scope of the disclosed technology, and all such modifications as would be obvious to those skilled in the art are intended to be included within the scope of the following claims.

An embodiment of the disclosed technology provides a TFT-LCD array substrate and manufacturing and repairing methods thereof, by which repairing problem of the prior art array substrate when a data line has a failure is solved.

An embodiment of the disclosed technology provides a TFT-array substrate, comprising a substrate and a first transparent conductive film, a gate layer, a gate insulating layer, a semiconductor layer, and a source/drain electrode layer sequentially formed on the base substrate from the bottom up.

The gate layer may comprise a gate electrode, a gate line and a common electrode line.

The source/drain electrode layer may comprise a data line and a source electrode and a drain electrode of a transistor. The first transparent conductive film comprises at least a first part and a second part apart from each other. The first part is located under the area of the data line, without contacting the gate line and the common electrode line.

A passivation layer and a second transparent conductive layer may be further formed over the source/drain electrode layer. A via hole is formed above a source electrode of a thin film transistor within the passivation layer to expose the source electrode, and the second transparent conductive layer can be connected to the source electrode through the via hole and work as a pixel electrode.

In an example, the gate line may be perpendicular to the data line. The second part may be located under the area defined by two adjacent gate lines and two adjacent data lines, without contacting the gate lines and the data lines, and the second part has a rectangular shape.

In an example, the length of the first part may not be larger than a distance between two adjacent gate lines.

In an example, the width of the first part may be larger or equal to a width of the data line.

In an example, the rectangular area defined by two adjacent gate lines and two adjacent data lines in the array substrate may construct a sub-pixel (pixel unit), and the amount of the first parts is equal to the amount of sub-pixels in the array substrate.

According to the embodiment, for each pixel unit the first transparent conductive film is designed to have two separate parts without contacting each other, and one of which is located under the data line. Thus, when a data line has for example an open failure, the part of the transparent conductive film located under the data line may be used as a standby line. That is, this part of the transparent conductive film may be welded together with the data line using laser welding so as to realize the data line repairing.

In the following, an AD-SDS type TFT-LCD array substrate according to an embodiment of the disclosed technology is described in detail by example.

The AD-SDS type TFT-LCD array substrate according to the embodiment is shown in FIG. 1; the array substrate includes a plurality of pixel units arranged in an array, and here only one pixel unit defined by the intersection of a data line and a gate line is shown for the purpose illustration.

The array substrate, for each pixel unit, comprises: a base substrate; a first transparent conductive film 30 deposited on the base substrate; a gate layer formed on the base substrate including a gate line 12 and a common electrode line 13; a gate insulating layer formed over the base substrate and covering the first transparent conductive film 30 and the gate layer; a semiconductor layer and a source/drain electrode layer formed over the gate line 12 and on the gate insulating layer, comprising source and drain electrodes 14 of the thin film transistor (TFT) and a data line 15; a passivation layer formed over the gate insulating layer and covering the source/drain electrode layer; and a second transparent conductive film formed on the passivation layer.

In the embodiment, the base substrate may a glass substrate or a plastic substrate. The first transparent conductive film 30 works as a common electrode of this AD-SDS array substrate, and comprises at least a first part 21 and a second part 22 electrically apart from each other for each pixel unit, and the first part 21 is located under the corresponding data line 15. In the example shown in the drawing, the first part 21 is in a long strip shape extending in the direction of the data line, and the second part 22 is in a rectangular shape corresponding to the display region of the pixel unit. Further, in the embodiment, a part of the gate line works as the gate electrode of the TFT.

During the manufacturing of the array substrate according to the embodiment, the following steps are performed. First, a first transparent conductive layer is deposited on the base substrate, and the first transparent conductive film 30 is formed through patterning the first transparent conductive layer to include a first part 21 and a second part 22, electrically apart from each other for each pixel unit. A typical patterning process comprises coating photoresist, exposing photoresist, developing to obtain a photoresist pattern, etching use the photoresist pattern as a mask, etc.

Then, a metal film is deposited on the base substrate having the first transparent conductive film 30 formed thereon, and a gate layer is formed through a patterning process. The gate layer comprises a gate electrode, a gate line 12, a common electrode and a common electrode line 13. The gate electrode may be a part of or connected with the gate line. A gate insulating layer is continuously deposited on the base substrate to cover the first transparent conductive film and the gate layer. A semiconductor layer and a conductive film 30 are deposited over the gate insulating layer. For example, the semiconductor layer is patterned into an island shape and the conductive film is also patterned into a source/drain electrode layer. The source/drain electrode layer comprises TFT transistor source and drain electrodes 14 and a data line 15, and the data line 15 is for example connected with the source drain electrode. A passivation layer is formed on the gate insulating layer and the source/drain electrode layer. A second transparent conductive film is deposited on the passivation layer.

The first transparent conductive film is designed to have a first part 21 and a second part 22, which do not contact with each other. Here, as the first part 21 will be used as a standby line for a data line open failure, it is provided right under the data line 15 of the corresponding pixel unit. Specifically, the first part 21 may have the same shape as that of the data line 15, that is, an elongate stripe shape. The width of the first part 21 may be adjusted according to requirement. The first part 21 does not contact or overlap with the gate line 12, that is, the first part 21 is positioned in an area between two adjacent rows of pixel units (excluding an area of the gate line and the common electrode line) or two adjacent gate lines and located under the area of the data line. The second part 22 may be designed in a conventional way under the rectangular area defined by the gate line 12 and the data line 15 and may have a rectangular shape. As shown in the drawing, the upper edge of the second part 22 may be located under the gate line 12 without contacting the gate line 12, but may contact with or aligned with the common electrode line 13 and therefore the second part can be applied a common voltage from the common electrode line. The right edge of the second part 22 may be located to the left of the data line 15 without contacting the data line 15. The second part 22 functions mainly to form a capacitor with the second transparent conductive film on a higher level, and a horizontal electric field is generated to realize display using LC molecules.

Specifically, a rectangular area defined by two adjacent gate lines and two adjacent data lines in the array substrate forms a sub-pixel (pixel unit), and throughout the array substrate, the amount of the first parts is equal to the amount of sub-pixels in the array substrate. That is, in general, each sub-pixel includes to one second part 22 of the first transparent conductive film, and one data line in each sub-pixel corresponds to one first part 21 of the first transparent conductive film. The first part 21 may also be referred to as "laser repairing assist pattern." In an example, a first part 21 (the laser repairing assist pattern), which corresponds to one data line of each sub-pixel, may also be designed as several discontinuous sections. Thus, when one data line has more than one open failure, the first transparent conductive film may provide several standby lines for carrying out repairing section by section. In other examples, the laser repairing assist pattern may be designed in other shape, as long as the repairing can be achieved.

The base substrate in the embodiment may be a glass substrate. The transparent conductive film may be a single layer indium tin oxide (ITO) or indium zinc oxide (IZO) film, or a composite film thereof.

FIG. 1 is a diagram showing repairing an array substrate after a source/drain electrode layer is formed according to an embodiment of the disclosed technology. As shown in FIG. 1, a data line 15 of one pixel unit has an open portion 16 in its central portion. Two ends adjacent the open portion 16 are used as laser welding points 17 where the first part 21 of the first transparent conductive film 30 and the data line 15 are welded together by using laser welding to accomplish the repairing of the data line, and the broken data line 15 becomes electrically continuous again.

Figure 3:
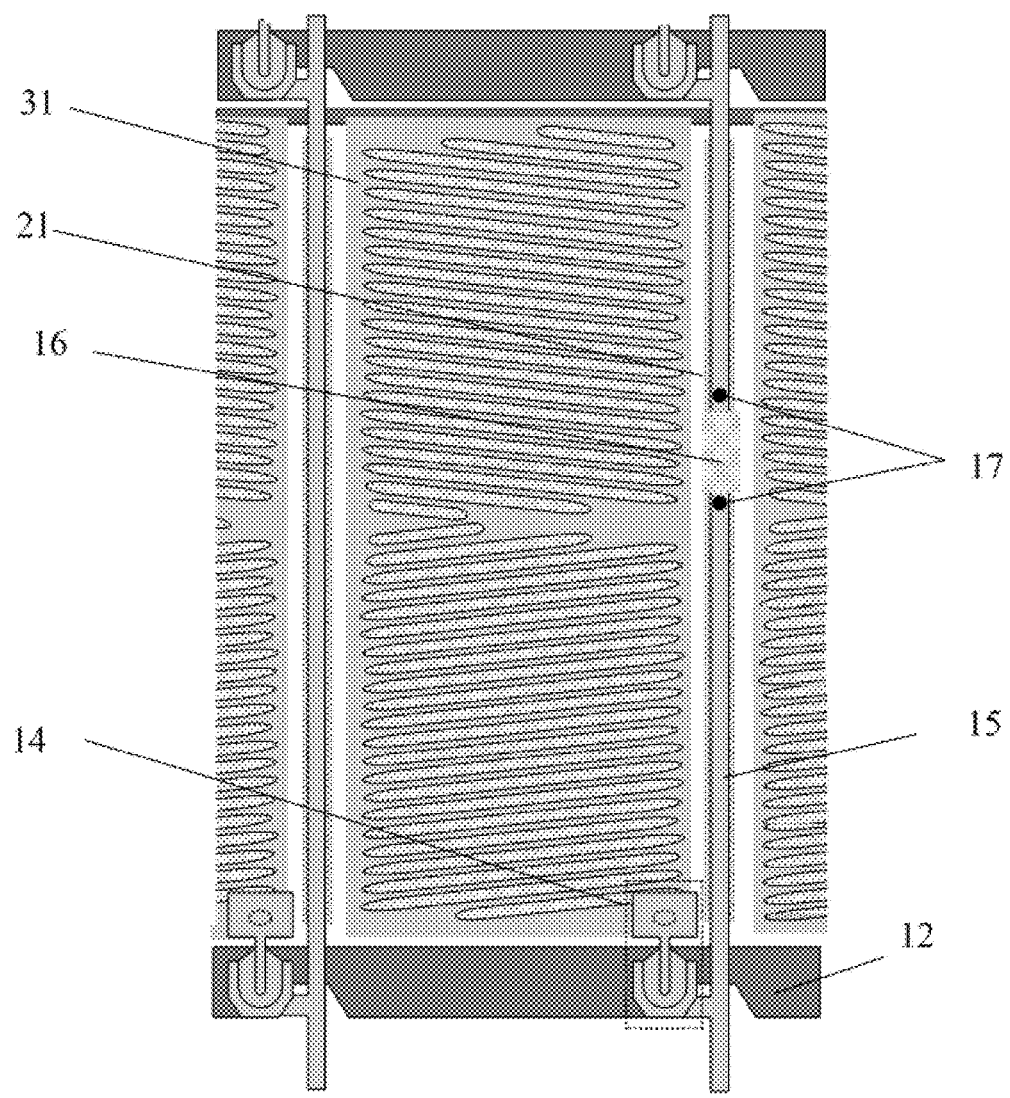
FIG. 3 is a structural diagram of an array substrate during a data line repairing after a second transparent conductive film is formed according to an embodiment of the disclosed technology.

FIG. 3 is a diagram showing repairing an array substrate after a second transparent conductive film 31 is formed according to an embodiment of the disclosed technology. The second transparent conductive film 31 is also formed in addition to the first and second parts of the first transparent conductive film 30, the TFT source and drain electrodes 14, the gate line 12 and the data line 15. Likewise, when a data line 15 has an open portion 16, two ends adjacent the open portion 16 of the data line 15 are used as laser welding points 17 where the first part 21 of the first transparent conductive film 30 and the data line 15 are welded together by using laser welding to accomplish the repairing of the broken data line 15 so that it becomes electrically continuous again.

According to the embodiment, the first transparent conductive film is designed to have two separate parts that do not contact with each other. One of the two parts is located right under the data line. Thus, when a data line has for example an open failure, the part of the transparent conductive film located under the data line can be used as a standby line. That is, this part of the transparent conductive film may be welded together with the data line using laser welding so as to accomplish the repairing of the data line and have the broken data line electrically continuous again. In this way, the repairing of the data line can be accomplished directly by using laser welding. As a result, the repairing may be performed in a convenient manner and at a low cost, without damaging other elements on the array substrate.

An embodiment of the disclosed technology further provides a display device, which comprises the above-described AD-SDS type TFT-LCD array substrate. The display device further comprises a color filter substrate, and the color filter substrate is assembled with the array substrate to form a display panel with a liquid crystal layer between the substrates facing each other. The display device may further comprises a backlight module provided on a side of the display panel for providing light for display.

An embodiment of the disclosed technology also provides a manufacturing method for an AD-SDS type TFT-LCD array substrate, comprising the following steps.

Step S401, forming a first transparent conductive film on a base substrate, which has separate first and second parts that do not contact with each other.

Step S402, sequentially forming a gate layer, a gate insulating layer, a semiconductor layer, and a source/drain electrode layer from the bottom up on the base substrate having the first transparent conductive film 30 formed thereon. The step may further comprise forming a passivation layer and a second transparent conductive layer on the source/drain electrode layer.

The gate layer may comprise a gate electrode, a gate line and a common electrode line. The source/drain electrode layer may comprise a data line 15 and transistor source and drain electrodes. The first part of the first transparent conductive film 30 is located right under the area of the data line 15 without contacting the gate line 12.

In an example, the gate line 12 is perpendicular to the data line 15; the gate electrode is a part of or connected with the gate line 12; and the data line 15 is connected with the source electrode of the thin film transistor of a pixel unit.

The first transparent conductive film 30 for each pixel unit has separate first part 21 and a second part 22, which do not contact with each other, from the first transparent conductive layer through a patterning process including exposure and etching processes.

The step of sequentially forming a gate layer, a gate insulating layer, a semiconductor layer, a source/drain electrode layer, a passivation layer, and a second transparent conductive film 31 from the bottom up over the base substrate having the first transparent conductive film formed thereon comprises:

depositing a metal film on the substrate having the first transparent conductive film 30 formed thereon, and forming a gate electrode, a gate layer including a gate line 12 and a common electrode line through an etching process;

sequentially depositing a gate insulating layer, which is formed on the base substrate to cover the first transparent conductive film 30 and the gate layer;

depositing a semiconductor layer and a conductive film on the gate insulating layer, and forming a semiconductor pattern, a source/drain electrode layer including a source electrode and a drain electrode and a data line 15 through a patterning processes;

depositing a passivation layer on the base substrate to cover the source/drain electrode layer, and depositing a second transparent conductive film 31 on the passivation layer.

The passivation layer may be patterned to form a via hole therein to expose the source electrode, and the second transparent conductive film 31 is connected with the source electrode through the via hole.

In an example, for each pixel unit, the first part 21 of the first transparent conductive film 30 has a same shape as that of the data line 15 in a long strip shape, and the length of the first part 21 is not larger than the distance between two adjacent gate lines or two rows of pixel units.

Further, a method for repairing an AD-SDS type TFT-LCD according to the embodiment of the disclosed technology is provided. The method comprises the following steps.

Step S501, determining a failure pixel unit on the array substrate.

Step S502, determining the position of the data line 15 in the source/drain electrode layer of the failure pixel.

Step S503, connecting the first part 21 of the first transparent conductive film 30 of the failed pixel unit and the data line 15 by using laser welding at the determined position.

In this way, the repairing of the data line 15 can be accomplished directly by using laser welding. As a result, the repairing can be performed in a convenient manner and at a low cost, without damaging other elements on the array substrate.

It should be appreciated that the embodiments described above are intended to illustrate but not limit the disclosed technology. Although the disclosed technology has been described in detail herein with reference to the preferred embodiments, it should be understood by those skilled in the art that the disclosed technology can be realized with different material and equipment as necessary, and that various modification and equivalents thereof can be made herein without departing from the spirit and scope of the disclosed technology.

What is claimed is:

1. A thin film transistor liquid crystal display (TFT-LCD) comprising:
    a base substrate;
    a plurality of pixel units arranged in an array on the base substrate; and
    a first transparent conductive film formed on the base substrate,
    wherein each pixel unit of the plurality of pixel units comprises a gate line, a common electrode line, a data line and a transistor, the first transparent conductive film comprises at least a first part and a second part that do not contact with each other, and the first part is located under an area of the data line, without contacting the gate line and the common electrode line.

2. The TFT-LCD array substrate of claim 1, wherein the gate line is perpendicular to the data line, and the second part is located within an area surrounded by two adjacent gate lines and two adjacent data lines, without contacting the gate lines and the data lines.

3. The TFT-LCD array substrate of claim 1, wherein the second part has a rectangular shape.

4. The TFT-LCD array substrate of claim 1, wherein a length of the first part is not larger than a distance between two adjacent gate lines.

5. The TFT-LCD array substrate of claim 1, wherein a width of the first part is larger or equal to a width of the data line.

6. A display device, comprising the TFT-LCD array substrate according to claim 1.

7. A method for repairing the TFT-LCD array substrate according to claim 1, comprising
    determining a failure pixel unit on the array substrate;
    determining a position of a data line of the failure pixel unit; and
    connecting the first part of the first transparent conductive film and the data line of the failure pixel unit by using laser welding at determined positions.

* * * * *